(12) United States Patent
Jaeger et al.

(10) Patent No.: US 11,621,255 B2
(45) Date of Patent: Apr. 4, 2023

(54) OPTOELECTRONIC COMPONENT HAVING AN OPTICAL ELEMENT WITH DIFFERENT INNER SURFACE REGIONS

(71) Applicant: OSRAM Opto Semiconductors GmbH, Regensburg (DE)

(72) Inventors: Claus Jaeger, Regensburg (DE); Stephan Haslbeck, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 350 days.

(21) Appl. No.: 16/608,356

(22) PCT Filed: Apr. 25, 2018

(86) PCT No.: PCT/EP2018/060607
§ 371 (c)(1),
(2) Date: Oct. 25, 2019

(87) PCT Pub. No.: WO2018/197567
PCT Pub. Date: Nov. 1, 2018

(65) Prior Publication Data
US 2020/0212024 A1    Jul. 2, 2020

(30) Foreign Application Priority Data
Apr. 27, 2017  (DE) .......................... 102017109079.7

(51) Int. Cl.
*H01L 31/0203*  (2014.01)
*H01L 31/0232*  (2014.01)
(Continued)

(52) U.S. Cl.
CPC .......... *H01L 25/167* (2013.01); *H01L 25/165* (2013.01); *H01L 31/0203* (2013.01);
(Continued)

(58) Field of Classification Search
CPC ............................ H01L 33/58; F21K 9/65–69
See application file for complete search history.

(56) References Cited

U.S. PATENT DOCUMENTS

| 8,104,930 B2 | 1/2012 | Zhang et al. |
| 8,454,205 B2 | 6/2013 | Holder et al. |

(Continued)

FOREIGN PATENT DOCUMENTS

| DE | 102017130779 A1 * | 2/2019 | ......... G06K 9/00604 |
| EP | 2400568 A2 | 12/2011 | |

(Continued)

*Primary Examiner* — Kevin Parendo
(74) *Attorney, Agent, or Firm* — Slater Matsil, LLP

(57) ABSTRACT

An optoelectronic component and an assembly with an optoectronic component are disclosed. In an embodiment an optoelectronic component includes an optical element with an outer surface and an inner surface that faces away from the outer surface, wherein the inner surface includes a first region of the optical element, in which the inner surface is flat, wherein the inner surface includes a second region of the optical element, wherein the second region adjoins the first region, and wherein the inner surface includes a third region of the optical element, in which the inner surface extends from the second region in the direction of a housing.

19 Claims, 9 Drawing Sheets

(51) Int. Cl.
    *H01L 33/48*       (2010.01)
    *H01L 33/58*       (2010.01)
    *H01L 31/14*       (2006.01)
    *H01L 25/16*       (2006.01)

(52) U.S. Cl.
    CPC ........ *H01L 31/02325* (2013.01); *H01L 31/14* (2013.01); *H01L 33/486* (2013.01); *H01L 33/58* (2013.01)

(56) References Cited

U.S. PATENT DOCUMENTS

| | | | |
|---|---|---|---|
| 8,975,646 B2 | 3/2015 | Arndt | |
| 2005/0167682 A1 | 8/2005 | Fukasawa | |
| 2010/0006877 A1* | 1/2010 | Chen | H01L 33/58 257/98 |
| 2010/0302786 A1 | 12/2010 | Wilcox et al. | |
| 2012/0307503 A1 | 12/2012 | Wilcox et al. | |
| 2014/0361200 A1* | 12/2014 | Rudmann | H01L 25/50 250/578.1 |
| 2015/0252961 A1 | 9/2015 | Markytan et al. | |
| 2016/0240721 A1* | 8/2016 | Chu | G01J 1/0437 |

FOREIGN PATENT DOCUMENTS

| | | | | |
|---|---|---|---|---|
| EP | 2416458 A1 | 2/2012 | | |
| EP | 3057138 A1 | 8/2016 | | |
| EP | 3057142 A2 * | 8/2016 | ............ | A61B 5/681 |
| JP | 2005018174 A | 1/2005 | | |
| WO | 2005117071 A2 | 12/2005 | | |
| WO | 2014049031 A1 | 4/2014 | | |
| WO | 2014145802 A2 | 9/2014 | | |

* cited by examiner

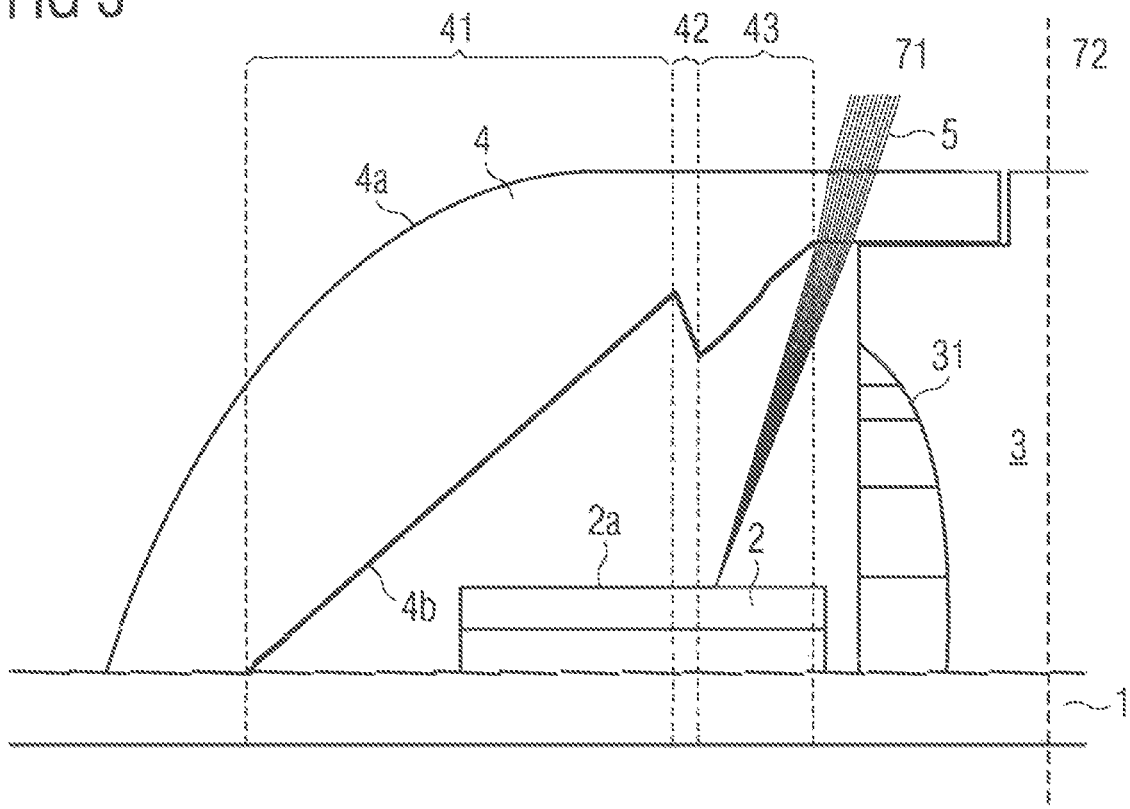

OPTOELECTRONIC COMPONENT HAVING AN OPTICAL ELEMENT WITH DIFFERENT INNER SURFACE REGIONS

This patent application is a national phase filing under section 371 of PCT/EP2018/060607, filed Apr. 25, 2018, which claims the priority of German patent application 102017109079.7, filed Apr. 27, 2017, each of which is incorporated herein by reference in its entirety.

TECHNICAL FIELD

An optoelectronic component is specified.

BACKGROUND

International application publication no. WO 2005/117071 A2 describes an optoelectronic component.

SUMMARY OF INVENTION

Embodiments provide an optoelectronic component for which the emission characteristic can be set particularly precisely. Further embodiments provide an optoelectronic assembly with at least one such component.

According to at least one embodiment of the optoelectronic component, the optoelectronic component comprises a carrier with a mounting surface on an upper side of the carrier. The carrier can be, for example, a connection carrier comprising contact points and conductor paths for contacting a semiconductor chip. For example, the carrier is a printed circuit board or a lead frame.

On its upper side, the carrier has a mounting surface, which is provided to accommodate additional elements of the optoelectronic component. The carrier is configured to mechanically support and carry additional elements of the optoelectronic component. In particular, the carrier can be the mechanically supporting element of the optoelectronic component.

According to at least one embodiment of the optoelectronic component, the component comprises an optoelectronic semiconductor chip with a main surface facing away from the carrier. The optoelectronic semiconductor chip can be, for example, a radiation-emitting semiconductor chip, such as a light-emitting diode chip or a laser diode chip. Furthermore, it is possible that the optoelectronic semiconductor chip is a radiation-receiving semiconductor chip, such as a photodiode chip. The optoelectronic component comprises one or more optoelectronic semiconductor chips. In particular, the optoelectronic semiconductor component comprises one or more radiation-emitting semiconductor chips or one or more radiation-receiving semiconductor chips.

The optoelectronic semiconductor chip has a main surface that is arranged opposite the carrier. A main surface of the semiconductor chip is the portion of the outer surface of the semiconductor chip that is parallel to a main extension plane of the semiconductor chip. For example, the main surface facing away from the carrier is the largest surface of the optoelectronic semiconductor chip in terms of surface area besides the main surface of the semiconductor chip facing the carrier. Side surfaces of the optoelectronic semiconductor chip, each of which has a smaller surface area than the main surfaces, connect the two main surfaces with each other. If the optoelectronic semiconductor chip is a radiation-emitting semiconductor chip, a portion, in particular a large portion, i.e., at least 50%, of the emitted electromagnetic radiation leaves the semiconductor chip through this main surface. If the optoelectronic semiconductor chip is a radiation-receiving semiconductor chip, a portion, in particular a large portion, of the electromagnetic radiation received by the semiconductor chip during operation is coupled through the main surface into the semiconductor chip. Here and in the following, "electromagnetic radiation" is understood to mean electromagnetic radiation in the wavelength range between infrared radiation and UV radiation, for example visible light.

According to at least one embodiment of the optoelectronic component, the component comprises a housing that is designed to be impermeable to radiation. The radiation-impermeable housing can have inner surfaces which face the semiconductor chip and which can be radiation-absorbing and/or radiation-reflective. The housing can be mechanically fixed to the carrier. In particular, it is possible that the carrier and the housing are connected to each other in a firmly bonded manner, or that the housing and the carrier are designed to be one piece.

According to at least one embodiment, the optoelectronic component comprises an optical element with an outer surface and an inner surface facing away from the outer surface. The optical element is formed, for example, by a body that is designed to be permeable to radiation, for example transparent. For this purpose, the optical element can be formed with a plastic, an epoxy, a silicone and/or a glass, or it can consist of one of these materials. The outer surface of the optical element borders the optical element toward the outside; that is to say, on its side facing away from the optoelectronic semiconductor chip. The optical element can be a radiation-shaping optical element, such as a lens, and/or a radiation-directing optical element, such as a prism. This means that the optical element can be configured to scatter, concentrate and/or change the direction of electromagnetic radiation.

According to at least one embodiment of the optoelectronic component, the optoelectronic semiconductor chip is arranged on the mounting surface so as to face the inner surface of the optical element. For example, the optoelectronic semiconductor chip can be mechanically attached and electrically connected to the mounting surface of the carrier. This means that the optoelectronic semiconductor chip can be electrically operated via the carrier. In this case, the optoelectronic semiconductor chip faces the inner surface of the optical element. This means that if, for example, the optoelectronic semiconductor chip is a radiation-emitting semiconductor chip, electromagnetic radiation emitted by the semiconductor chip initially strikes the inner surface, then passes through the optical element if applicable and exits at the outer surface.

According to at least one embodiment of the optoelectronic component, the housing partially surrounds the optoelectronic semiconductor chip. The housing surrounds the optoelectronic semiconductor chip on at least one of its side surfaces. This means that the housing then extends along this side surface. On one side surface, the housing thus constitutes a radiation-impermeable barrier for electromagnetic radiation that is emitted by the semiconductor chip during operation or that is to be received by the semiconductor chip.

The housing can also surround the optoelectronic semiconductor chip on other side surfaces. In particular, however, at least one side surface of the optoelectronic semiconductor chip is not surrounded by the housing. This means that no cavity whose inner walls completely surround the optoelectronic semiconductor chip on the side, i.e., in lateral directions, is formed in the housing, but the housing is preferably not arranged on at least one side surface of the optoelectronic semiconductor chip. The optoelectronic component is therefore free of the housing on one side surface of the optoelectronic semiconductor chip.

According to at least one embodiment of the optoelectronic component, the inner surface of the optical element comprises a first region in which the inner surface is designed to be flat and extends from the mounting surface in the direction of the housing transversely to the main surface of the semiconductor chip. This means that, in this flat region of the inner surface, the inner surface does not extend in parallel to the main surface of the semiconductor chip but at an angle.

According to at least one embodiment of the optoelectronic component, the inner surface comprises a second region in which the inner surface extends in the direction of the semiconductor chip, wherein the second region adjoins the first region. In particular, it is possible for the first region and the second region to be directly adjacent and for the inner surface to transition from the first region to the second region without interruption. In the second region, the inner surface extends in the direction of the semiconductor chip. This means that in the second region, the optical element has a protrusion that is directed in the direction of the semiconductor chip. For example, the optical element in the second region has a jag or a curve that extends in the direction of the semiconductor chip. In particular, the inner surface in the first region does not extend in parallel to the inner surface in the second region; rather, the regions of the inner surface extend transversely to each other.

According to at least one embodiment of the optoelectronic component, the inner surface comprises a third region in which the inner surface extends from the second region in the direction of the housing. The third region can directly border on the second region so that the inner surface transitions from the second region to the third region without interruption.

According to at least one embodiment, an optoelectronic component is specified with
  a carrier with a mounting surface on an upper side of the carrier,
  an optoelectronic semiconductor chip with a main surface facing away from the carrier,
  a housing that is designed to be impermeable to radiation, and
  an optical element with an outer surface and an inner surface facing away from the outer surface, wherein
  the optoelectronic semiconductor chip is arranged on the mounting surface so as to face the inner surface,
  the housing partially surrounds the optoelectronic semiconductor chip,
  the inner surface comprises a first region of the optical element, in which the inner surface is designed to be flat and extends from the mounting surface in the direction of the housing transversely to the main surface,
  the inner surface comprises a second region of the optical element, in which the inner surface extends in the direction of the semiconductor chip, wherein the second region adjoins the first region; and
  the inner surface comprises a third region of the optical element, in which the inner surface extends from the second region in the direction of the housing.

Optoelectronic components, which are designed to emit radiation, often illuminate the entire surrounding space with different emission characteristics. In the same manner, optoelectronic components that are designed to receive radiation often receive electromagnetic radiation from the entire surrounding space. An emission targeted only into a half-space around the optoelectronic component or a detection targeted only from a half-space around the optoelectronic component is not possible as a result. In a combination of radiation-emitting and radiation-receiving components, for example, this can result in unwanted cross-talk and reduced efficiency.

For narrow-angled radiating emitters, such as VCSEL components, a tilting of the emission characteristic can be produced by a lens, which suppresses cross-talk between an emitter and a receiver. With a component described here, however, it is now possible, for example due to the design of the optical element and/or the housing, to emit electromagnetic radiation in a targeted manner into a half-space, or to receive it from a half-space.

In the case of a radiation-emitting optoelectronic component, a semiconductor chip which has a wide-angled radiation and is formed, for example, by a light-emitting diode chip with a Lambert emission characteristic. It is thereby possible that the half-space is not only illuminated at a narrow angle; rather, a wide radiation and illumination of the entire half-space takes place.

Furthermore, such an optoelectronic component can be designed to be particularly compact and, for example, have a height of at most 1 mm.

According to at least one embodiment of the optoelectronic component, the optical element in the first region is configured to direct electromagnetic radiation in the direction of the second region. This means that at least a portion of the electromagnetic radiation that strikes the inner surface of the optical element in the first region is directed in the direction of the second region and strikes the inner surface of the optical element again there. This means that, due to the design of the optical element in the first region, the optical element in the second region is illuminated by electromagnetic radiation that is reflected or deflected in the first region.

According to at least one embodiment of the optoelectronic component, the optical element in the second region is configured to direct electromagnetic radiation in the direction of the third region. This means that, in the second region as well, for example by reflection or refraction, a portion of the electromagnetic radiation is deflected, which is coupled into the second region of the optical element in the direction of the third region. From there, the electromagnetic radiation for a radiation-emitting semiconductor chip can, for example, be directed to the outer surface of the optical element and finally out of the optical element. For a radiation-emitting semiconductor chip, electromagnetic radiation can be directed from the third region, for example, onto the radiation-receiving semiconductor chip.

According to at least one embodiment of the optoelectronic component, the second region of the optical element with the region of the inner surface extending in the direction of the semiconductor chip is arranged directly above the semiconductor chip. This means, for example, that in an orthogonal projection of the main surface of the semiconductor chip onto the inner surface of the optical element, the second region of the optical element is partially located in the projection. The same can apply to the third region of the optical element. This means that the semiconductor chip can in particular be positioned relative to the optical element in such a manner that the second region and/or the third region extend in sections in the projection of the semiconductor chip onto the inner surface of the lens. The same can also apply to the first region.

According to at least one embodiment of the optoelectronic component, the optical element borders on the mounting surface in the first region. The optical element can be in direct contact with the carrier on the mounting surface or can be connected to the carrier there in a firmly bonded manner, using an adhesive, for example. In particular, no additional element of the optoelectronic component, in particular no region of the housing, is then located between the optical element and the mounting surface of the carrier. In other words, the optical element extends from the mounting surface in the direction of the housing, wherein the optical element rests in places, in the first region of the optical element, on the mounting surface of the carrier.

At another place, the optical element can border on the housing. This means that the optical element can be in direct contact with the housing there or can be connected to the housing in a firmly bonded manner, using an adhesive, for example.

In this case, the housing is raised in relation to the mounting surface of the carrier so that, for example, the inner surface of the optical element extends obliquely from the mounting surface in the direction of the housing, at least in sections.

According to at least one embodiment of the optoelectronic component, no region of the housing is arranged on at least one side surface of the optoelectronic semiconductor chip. This means that, on at least one side surface, there is no section of the housing but, for example, the first region of the optical element. Especially where the optical element borders on the mounting surface of the carrier, there is then no region of the housing. For example, the housing surrounds the semiconductor chip on three side surfaces but not on one side surface. Due to the radiation-impermeable properties of the housing, radiation is thereby provided into a first half-space on the open side, where no housing is arranged. The optical element then ensures that as little electromagnetic radiation as possible is emitted into or detected from the opposite second half-space.

According to at least one embodiment of the optoelectronic component, the component comprises an additional optical element arranged between the third region and the housing. In this case, the additional optical element can be designed to be integral with the housing and/or the optical element. It is also possible that the additional optical element is a separately manufactured optical element that is not designed to be integral with the housing and/or optical element. The additional optical element can then be connected in a firmly bonded manner to the housing and/or the optical element, in particular to the housing and the optical element.

The additional optical element can be especially configured to change the direction of electromagnetic radiation. To this end, the additional optical element can be a refractive or reflective optical element, for example a prism. The additional optical element prevents in particular the emission or capture of electromagnetic radiation in or from the second half-space.

According to at least one embodiment of the optoelectronic component, the optoelectronic component is configured to detect electromagnetic radiation from a first half-space, wherein electromagnetic radiation from a second half-space is not detected. In such a case, the optoelectronic semiconductor chip is a radiation-receiving optoelectronic semiconductor chip.

According to at least one embodiment of the optoelectronic component, the component is configured to emit electromagnetic radiation into a first half-space, wherein no electromagnetic radiation is emitted into a second half-space. In this case, the optoelectronic semiconductor chip is a radiation-emitting optoelectronic semiconductor chip.

For example, the two half-spaces are complementary to each other. For example, a radiation-emitting optoelectronic semiconductor component emits electromagnetic radiation in an angle range between 0 and 90°, which illuminates the first half-space. The second half-space then covers the angle range between 90° and 180°, in which no or hardly any electromagnetic radiation is emitted.

An optoelectronic assembly is additionally specified. The optoelectronic assembly comprises at least one optoelectronic component described herein. This means that all features disclosed for the optoelectronic component are also disclosed for the optoelectronic assembly and vice versa.

Furthermore, the optoelectronic assembly in at least one embodiment comprises a detector with a detector chip. The detector chip is configured to receive electromagnetic radiation. In particular, the detector chip is configured to receive electromagnetic radiation that was emitted and reflected by the optoelectronic component.

According to at least one embodiment, the optoelectronic component of the assembly is configured to emit electromagnetic radiation in a first half-space, wherein no electromagnetic radiation is emitted in a second half-space, and the detector chip is configured to detect electromagnetic radiation.

In this case, the detector chip at least inter alia also detects electromagnetic radiation emitted by the optoelectronic component.

Furthermore, the optoelectronic semiconductor chip of the optoelectronic component and the detector chip in this embodiment are separated from each other by a portion of the housing. This means that the radiation-impermeable housing or at least a region of the radiation-impermeable housing is located between the radiation-emitting optoelectronic component and the detector.

It is in particular possible that the optoelectronic component and the detector are designed to be one piece. This can be achieved, for example, by arranging the detector chip in a region of the housing of the optoelectronic component. The optoelectronic semiconductor chip and the detector chip are then optically and spatially separated from each other by a region of the housing, for example by a housing wall.

Furthermore, it is also possible in particular that the optoelectronic assembly comprises two or more optoelectronic components that emit radiation. In this case, the detector can then be arranged between two of the optoelectronic components. This means that it is possible for a detector to be arranged between two optoelectronic components, wherein the optoelectronic components and the detector can be designed to be one piece.

BRIEF DESCRIPTION OF THE DRAWINGS

In the following, the optoelectronic component described herein and the optoelectronic assembly described herein are explained in more detail based on exemplary embodiments and the associated figures.

The schematic illustrations of FIGS. 1A, 1B, 2A, 2B, 3, 4A, 4B, 5A, 5B show exemplary embodiments of optoelectronic components described herein.

Figure 7A:
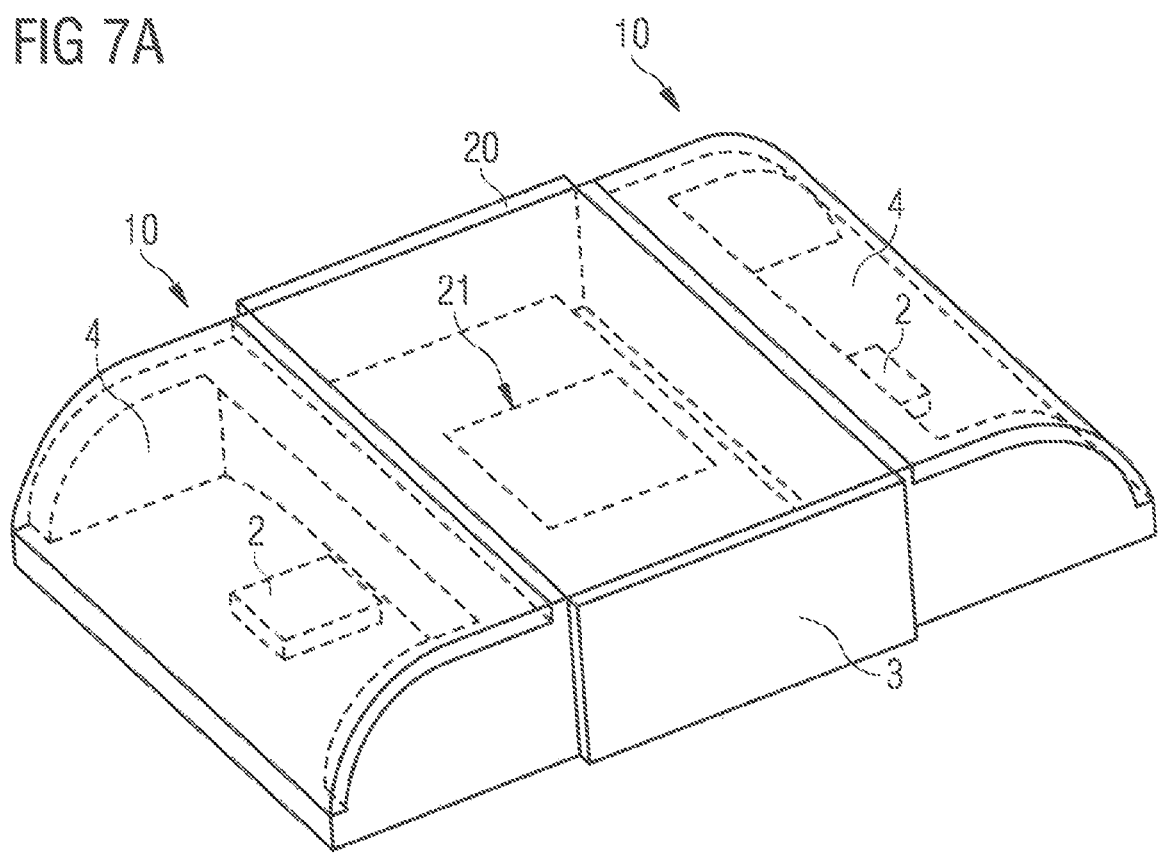
Figure 7B:
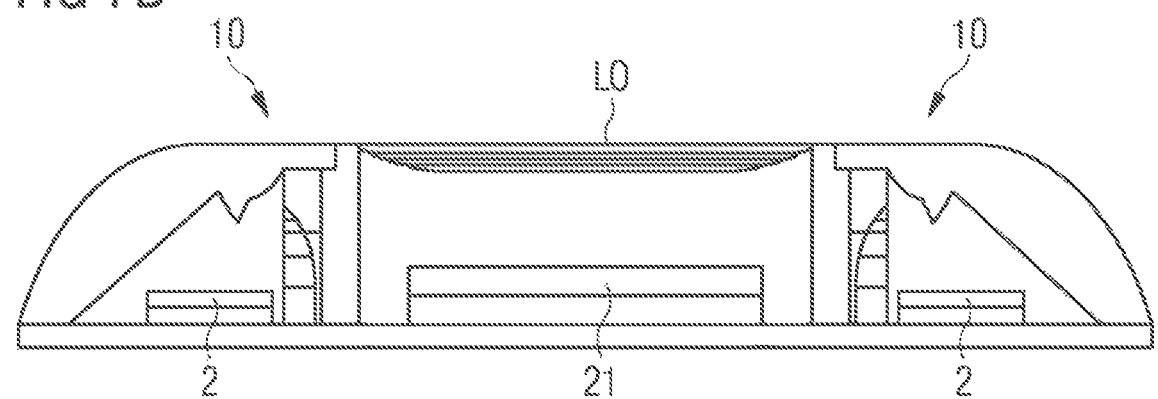

The schematic illustrations of FIGS. 7A and 7B show exemplary embodiments of optoelectronic assemblies described herein.

Figure 7C:
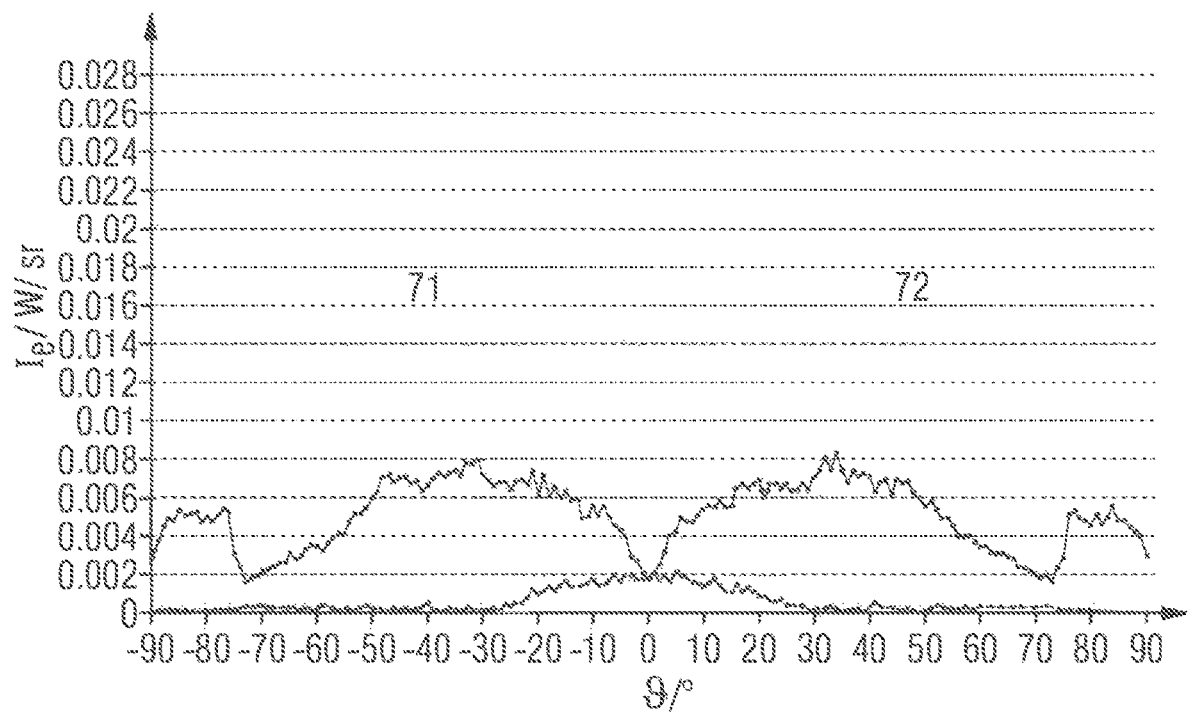
Figure 7D:
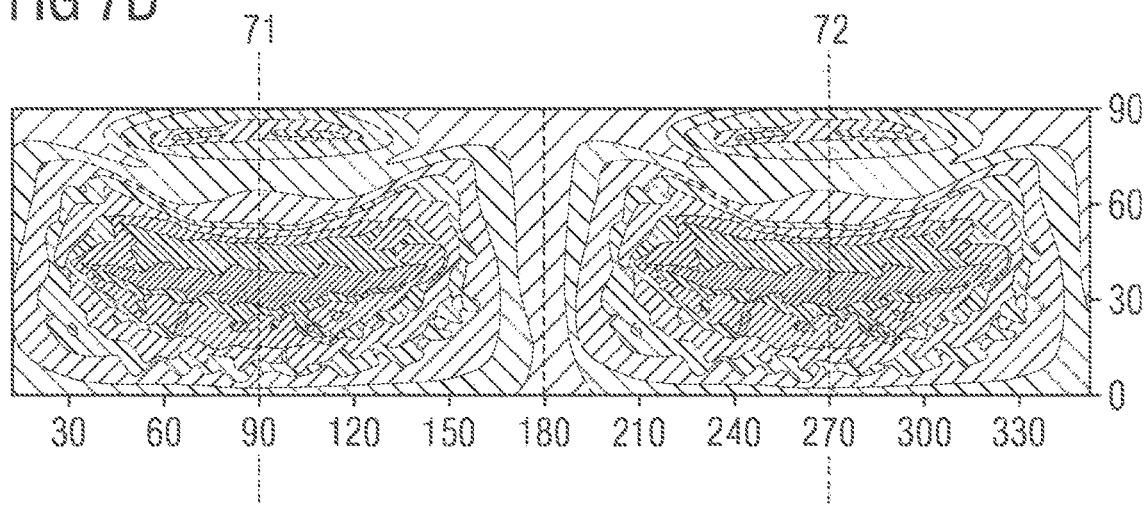

FIGS. 7C and 7D show graphs of optoelectronic assemblies described herein.

The schematic illustrations of FIGS. 8A, 8B, 8C, 8D show exemplary embodiments of optoelectronic assemblies described herein.

DETAILED DESCRIPTION OF ILLUSTRATIVE EMBODIMENTS

In the figures, the same, similar or similarly acting elements are provided with the same reference signs. The figures and the proportions of the elements illustrated in the figures are not to be regarded as true-to-scale. Rather, individual elements can be exaggerated in size for better illustration and/or better understanding.

Figure 1A:
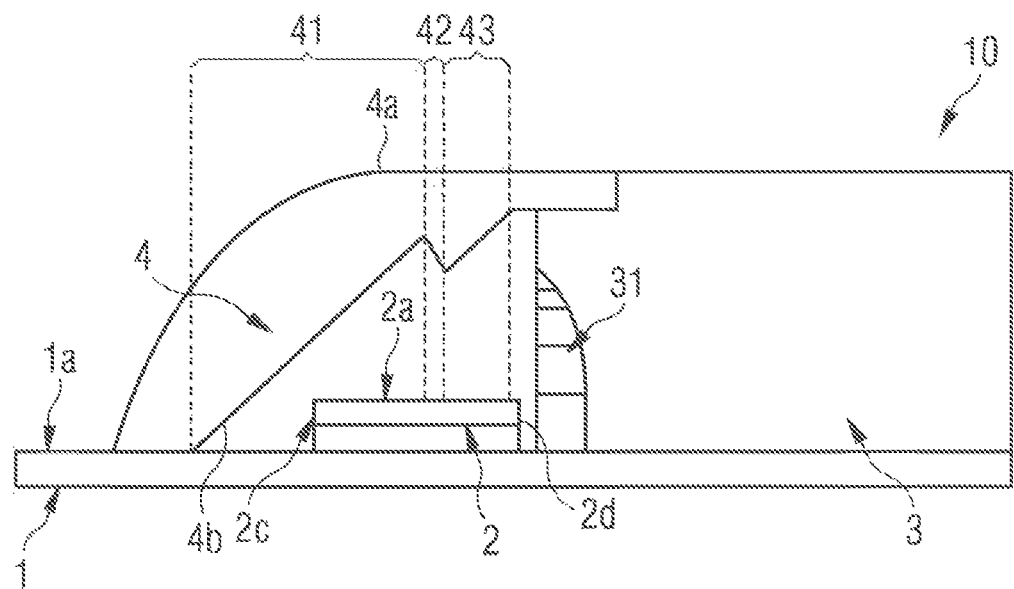
Figure 1B:
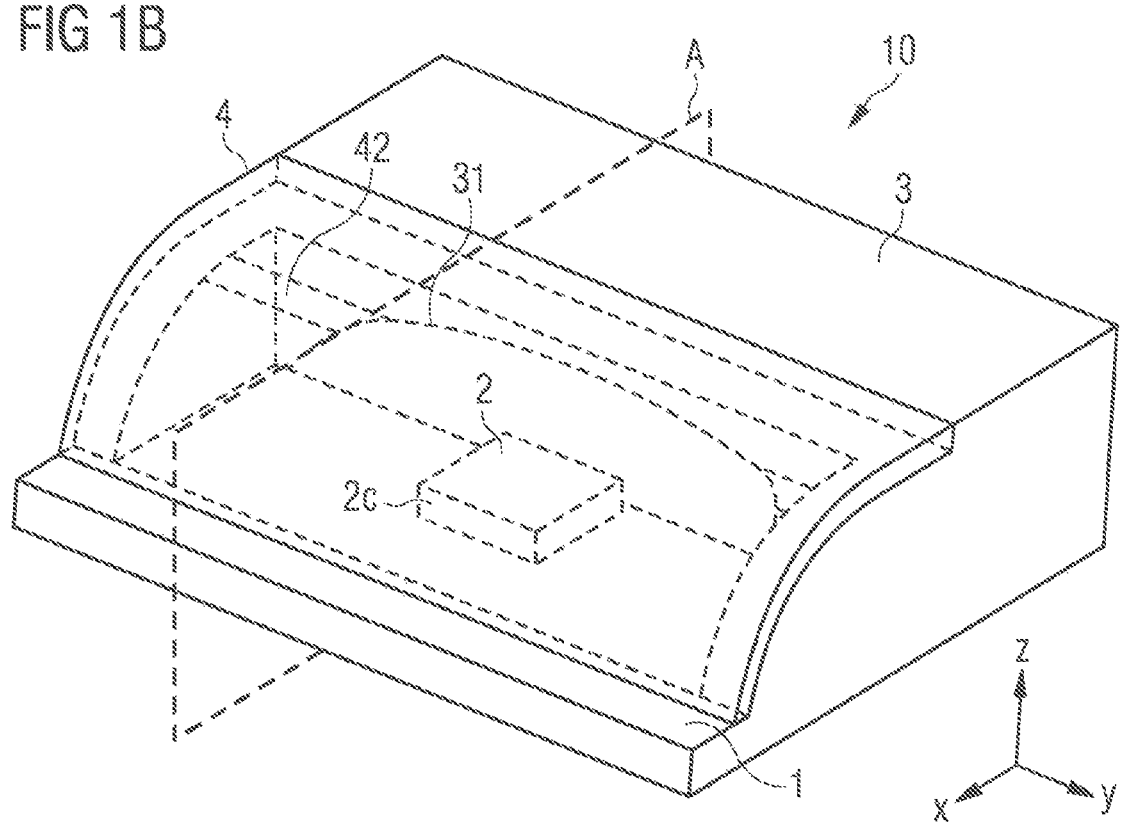

On the basis of the schematic illustrations of FIGS. 1A and 1B, one exemplary embodiment of an optoelectronic component described herein is explained in more detail. FIG. 1A shows a section in section plane A through the component shown in a perspective view in FIG. 1B.

The component comprises a carrier 1, which is, for example, a connection carrier. An optoelectronic semiconductor chip 2, which may be, for example, a radiation-emitting or radiation-detecting semiconductor chip, is arranged on the mounting surface is of carrier 1. The optoelectronic semiconductor chip 2 comprises side surfaces 2c, 2d and a main surface 2a facing away from the mounting surface is of the carrier 1. Apart from the side surface 2c, the semiconductor chip 2 is surrounded on all side surfaces by the housing 3, which is designed to be impermeable to radiation. For example, the housing 3 comprises a reflective region 31 provided to reflect electromagnetic radiation generated, for example, by the semiconductor chip 2 during operation. The reflective region 31 can also cover the entire surface of the housing 3 facing the semiconductor chip 2. In other words, the housing 3 can be designed to be reflective at least on its outer surface facing the semiconductor chip 2.

The optoelectronic component also comprises an optical element 4. The optical element 4 has an outer surface 4a that is convexly curved outward in places. The optical element 4 further comprises an inner surface 4b facing away from the outer surface 4a and facing the semiconductor chip 2.

The inner surface has a flat region in a first region 41 of the optical element 4. This means that the inner surface 4b is designed to be flat in the first region and smooth within the manufacturing tolerance. The first region 41 of the optical element 4 is adjoined by a second region 42, in which the inner surface 4b extends in the direction of the semiconductor chip 2. There, the optical element has a jag directed toward the semiconductor chip 2. A third region 43 of the optical element 4 follows; the third region follows the second region 42 and extends in the direction of the housing 3.

The optical element 4 borders directly on the carrier 1 and is attached to the mounting surface 1a on the carrier 1, for example. The optical element can be produced, for example, by techniques such as transfer molding or injection molding.

The housing 3 and the carrier 1 can be manufactured separately from each other or they can be designed to be one piece.

Figure 2A:
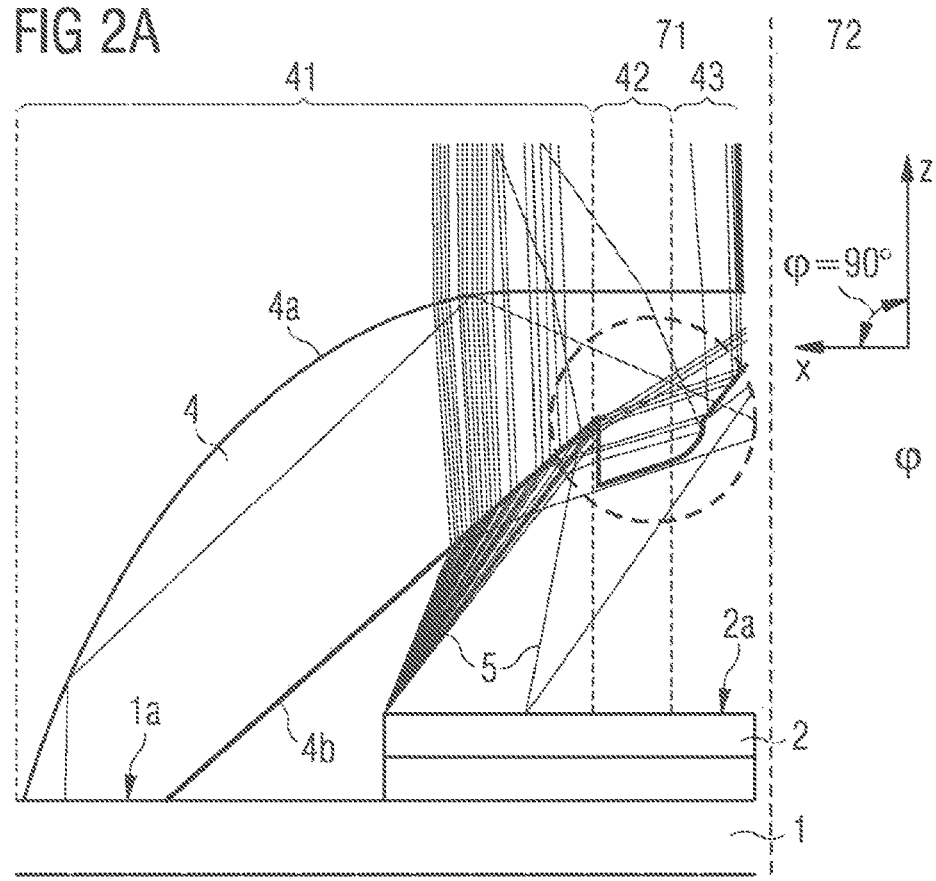

On the basis of the schematic sectional view of FIG. 2A, a partial aspect of the effect of the optical element 4 is explained in more detail. Electromagnetic radiation 5 emitted by the semiconductor chip 2 during operation strikes, for example, the inner surface 4b of the optical element 4 in the first region 41. There, it is partially transmitted by the optical element 4 and exits at the outer surface 4a. Another portion is reflected as Fresnel losses and is directed in the first region of the optical element 4 in the direction of the second region 42 of the optical element 4. In this case, directing can take place, for example, by means of reflection.

In the first region 41 of the optical element, the optical element therefore acts like a prism, whose flat side surface extends from the carrier 1 in the direction of the housing 3. The optical element in the first region 41 ensures that, if possible, no beams in the angle range >90° are directed to the x-direction shown in FIG. 2A. From the second region 42 of the optical element, the electromagnetic radiation is directed, for example, by means of refraction at the entrance through the inner surface 4b in the second region 42 in the direction of the third region 43. In the third region 43, the optical element 4 has a curved shape on its inner surface 4b so that the optical element 4 acts as a reflector there, for example. In this case, the reflection can take place by means of total reflection so that the second region and the third region overall act as a so-called TIR (total internal reflection) reflector, which deflect radiation into the angle range <90°.

Figure 2B:
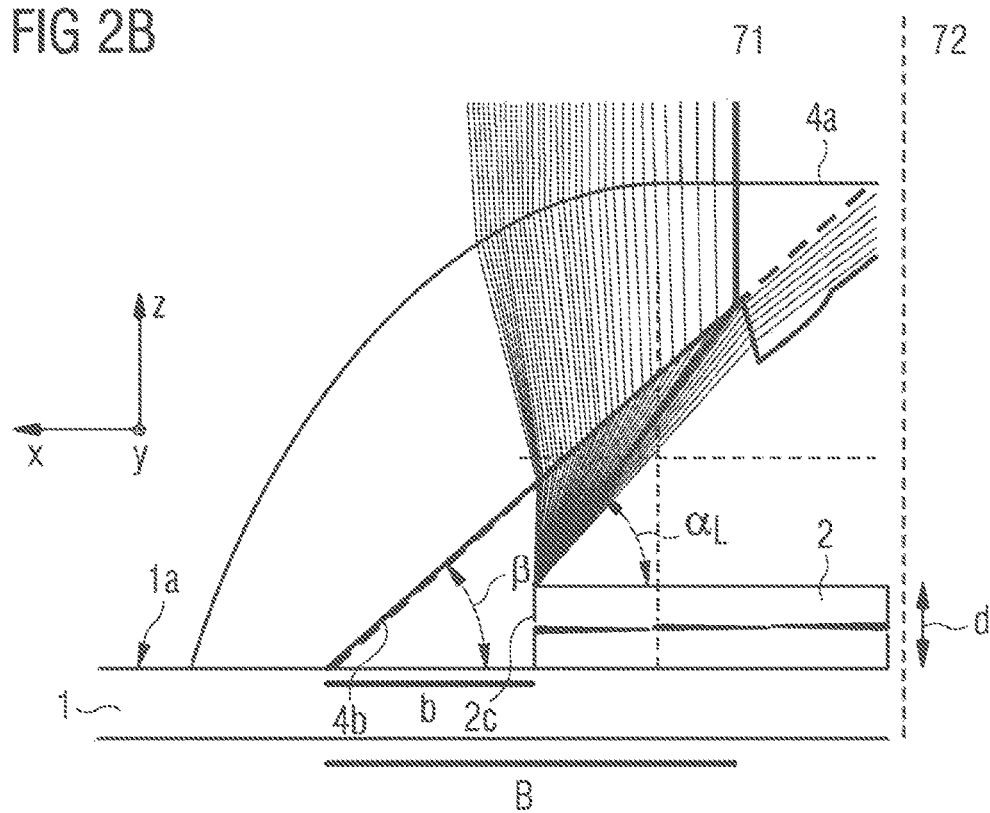

FIG. 2B explains that the length B of the flat region of the inner surface 4b in the first region 41 of the optical element 4 depends on the distance between the side surface 2c of the optoelectronic semiconductor chip 2, the thickness of the optoelectronic semiconductor chip d and the limit angle αL as well as the angle β between the inner surface 4b in the first region 41 and the mounting surface 1a. The following applies:

$$\alpha L = \arcsin(n \cdot \sin \beta), \text{ and}$$

$$B = (b - d/\tan \alpha L)/(1 - \tan \beta/\tan \alpha L).$$

Here, n is the refractive index of the material of the optical element 4. This means that a relationship between the angle β and the beam angle α can be derived from the law of refraction. Beams emitted from the side of the semiconductor chip 2 facing the first region 41 of the optical element 4 define the prism length from which electromagnetic radiation is refracted into the angle range greater than 90°. At this point is installed the second region 42 of the optical element 4, which directs the electromagnetic radiation onto the third region 43, where the optical element acts as a TIR reflector, for example. This ensures that the electromagnetic radiation is decoupled again at an angle <90°. The emission takes place in this manner in a first half-space 71 (cf., FIG. 6A) in an angle range between 0° and 90° and not in a second half-space 72 in the angle range between 90° and 180°.

In conjunction with FIG. 3, it is clear that electromagnetic radiation emitted by the semiconductor chip 2 in directions >90°, thus into the second half-space 72, can escape at the transition region between the third region 43 and the housing 3. This can be prevented by the use of an additional optical element 6, such as a prism, arranged in the corner between the optical element 4 and the housing 3.

Figure 4A:
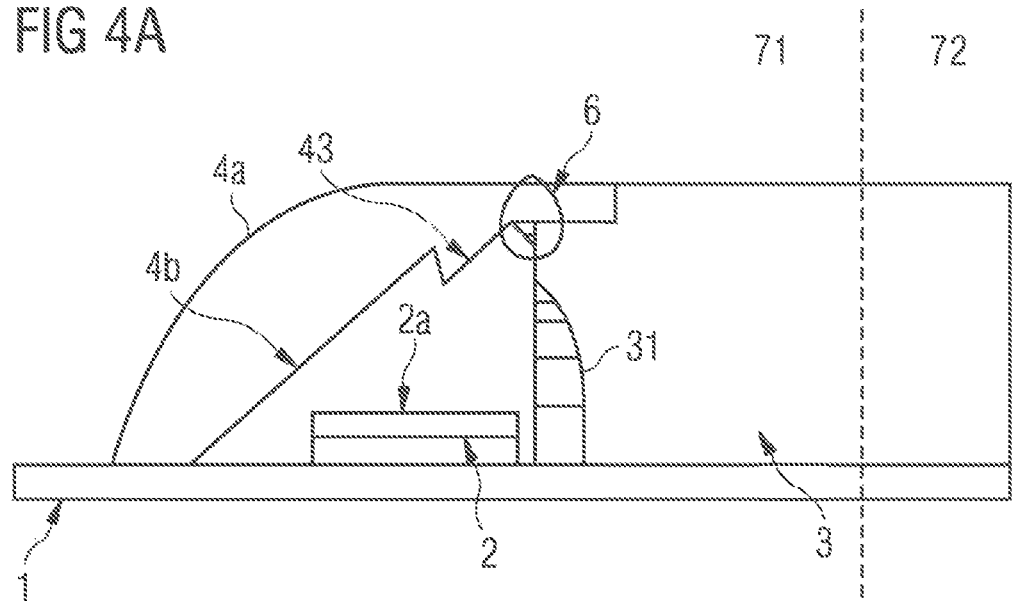
Figure 4B:
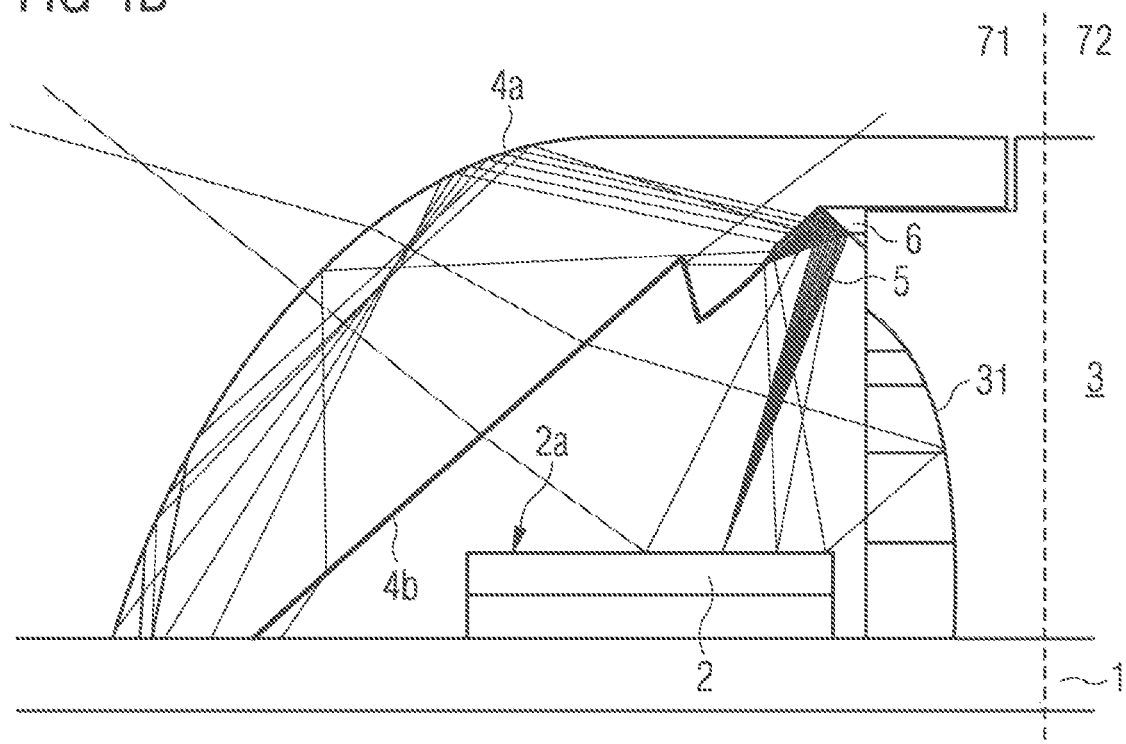

This is shown, for example, in the schematic illustration of FIG. 4A. FIG. 4B shows the effect of the additional optical element 6 on the electromagnetic radiation 5, wherein the additional optical element 6 is configured to change the direction of the electromagnetic radiation 5 in such a manner that a decoupling into the first half-space 71 takes place.

Figure 5A:
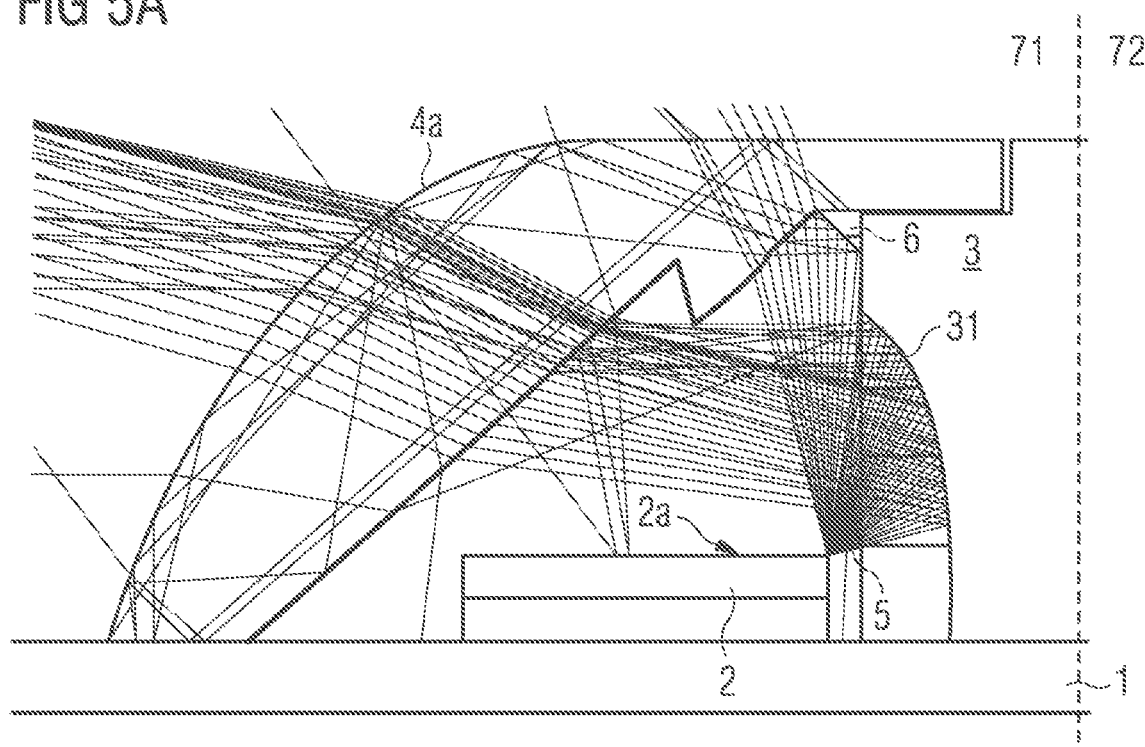

On the basis of the schematic sectional view of FIG. 5A, one design of the housing 3, in which a reflective region 31 is present, is described in more detail. This ensures that directly incident electromagnetic radiation 5 is directed in the direction of the outer surface 4a of the optical element 4 into the first half-space 71.

Figure 5B:
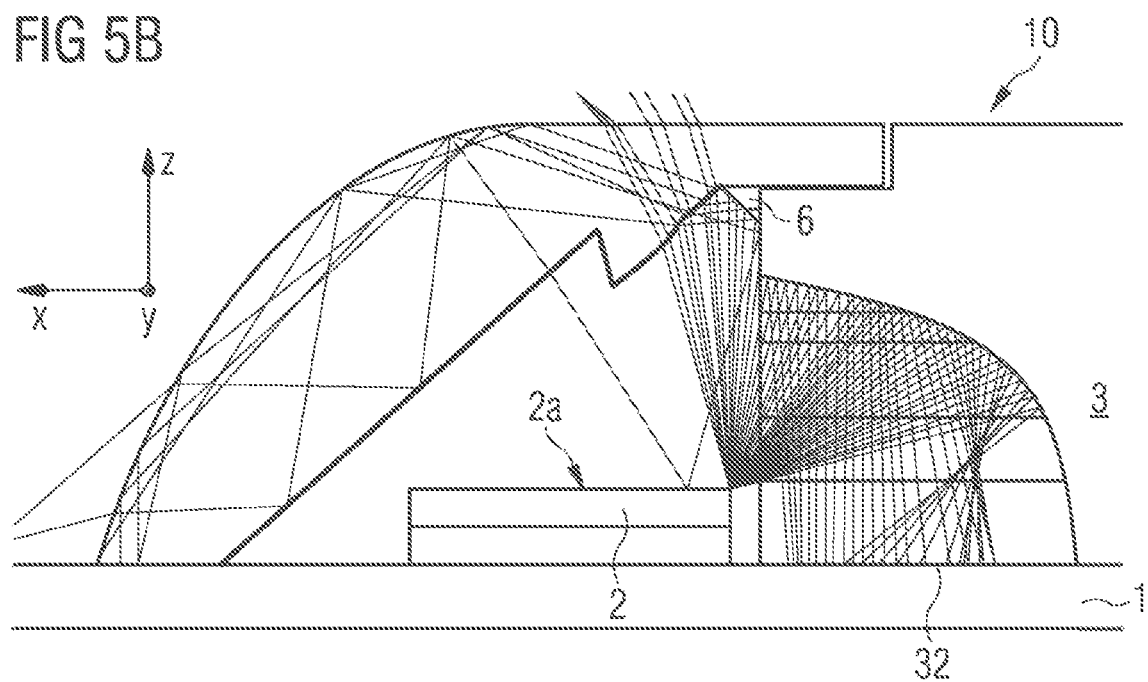

Alternatively (cf., the schematic sectional view of FIG. 5B), the housing can have a radiation-absorbing region 32 which serves as a beam trap. In this case, the electromagnetic radiation striking the housing 3 is partially absorbed.

Figure 6A:
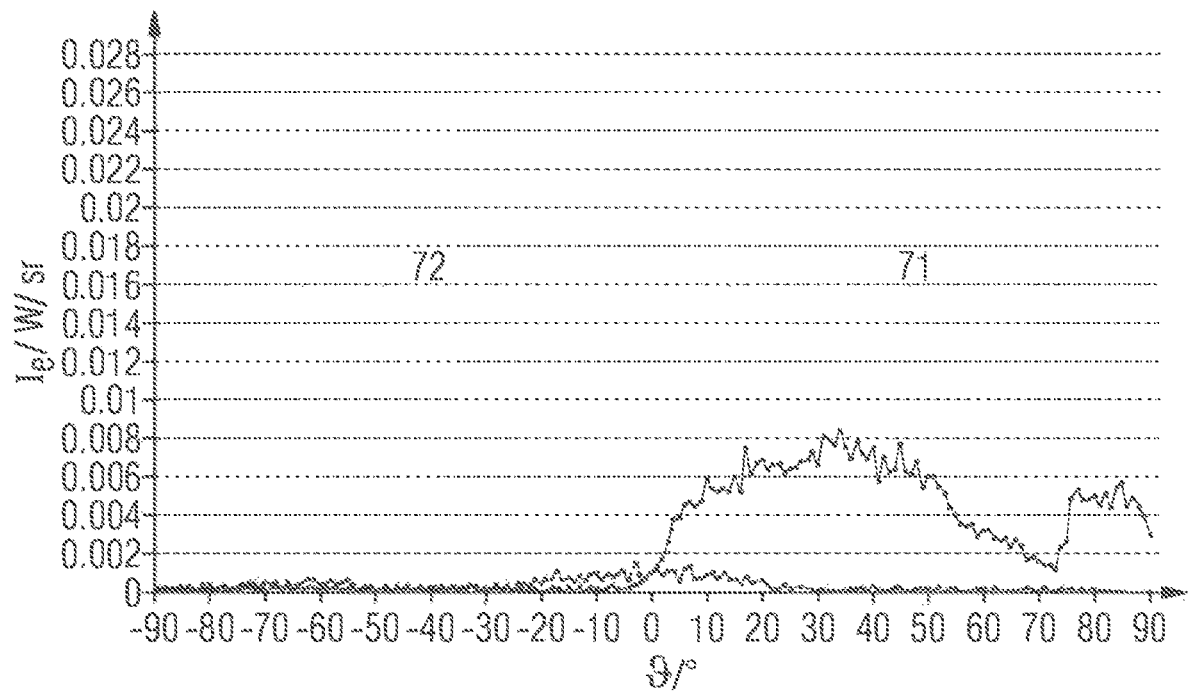
FIGS. 6A and 6B show graphs of one exemplary embodiment of an optoelectronic component described herein.
Figure 6B:
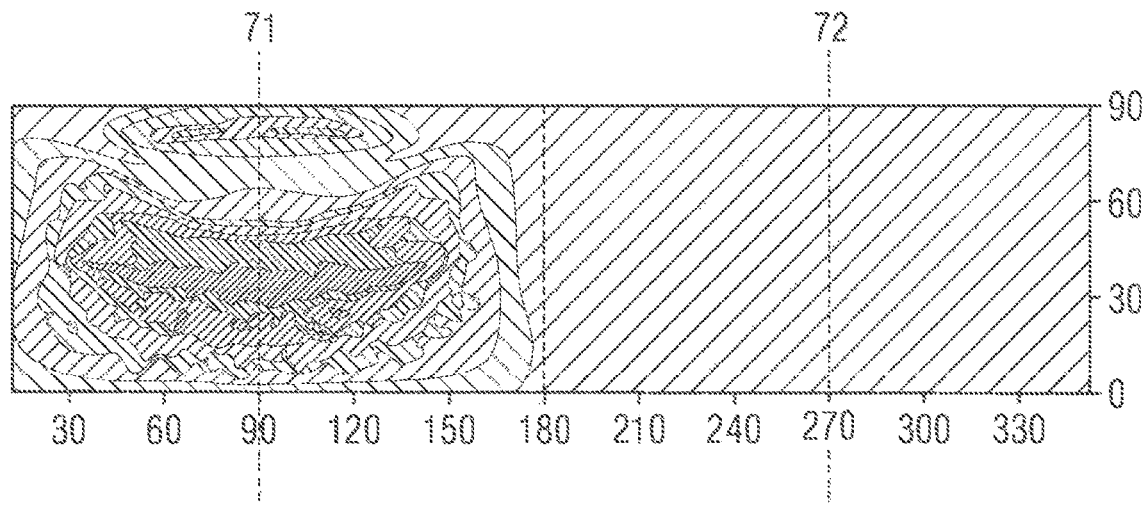

On the basis of the graphs of FIGS. 6A and 6B, the mode of action of the optoelectronic component described herein is explained. In the event that the optoelectronic semiconductor chip 2 emits radiation, the second half-space 72, with an angle between 90 and 180°, remains almost completely radiation-free. In FIG. 6A, the radiant intensity Ie in W/sr is plotted over the angle φ in °.

The graph of FIG. 6A specifies the angle-dependent radiant intensity in two orientations (the upper curve in the x-direction and the lower curve in the y-direction). This corresponds to the emission characteristic of the assembly. The graph of FIG. 6B is the two-dimensional illustration of the radiant intensity of the entire upper half-space (the section at 90° and 270° corresponds to the illustration of the upper curve in FIG. 6A). The darker an area in FIG. 6B is, the greater the radiant intensity.

In conjunction with the schematic illustrations of FIGS. 7A and 7B, an optoelectronic assembly described herein is explained in more detail. In the present case, the optoelectronic assembly comprises two optoelectronic components 10, as explained in more detail in conjunction with one of the preceding figures. Each of the two optoelectronic components comprises a radiation-emitting semiconductor chip 2. The detector 20, which comprises a detector chip 21, is arranged between the two optoelectronic components 10. The two optoelectronic components radiate electromagnetic radiation 5 into the two half-spaces 71 and 72. The detector chip 21, for example, detects reflected portions of this electromagnetic radiation.

FIGS. 7C and 7D show graphs to explain the optoelectronic assembly illustrated in conjunction with FIGS. 7A and 7B.

The graph of FIG. 7C shows the angle-dependent radiant intensity in two orientations (the upper curve in the x-direction and the lower curve in the y-direction). This corresponds to the emission characteristic of the assembly. The graph of FIG. 7D is the two-dimensional illustration of the radiant intensity of the entire upper half-space (the section at 90° and 270° corresponds to the illustration of the upper curve in FIG. 7C). The darker an area in FIG. 7D is, the greater the radiant intensity.

As can be seen from FIGS. 7A and 7B, the optoelectronic assembly comprises a housing 3, which is designed to be one piece for the two components 10 and the detector 20. The detector chip 21 is arranged in a cavity of the housing 3.

On the basis of FIGS. 8A to 8D, additional exemplary embodiments of optoelectronic assemblies described herein are explained in more detail. In the exemplary embodiment in FIG. 8A, the optoelectronic assembly comprises exactly one optoelectronic component 10 with a radiation-emitting semiconductor chip 2 and exactly one detector 20.

Figure 8A:
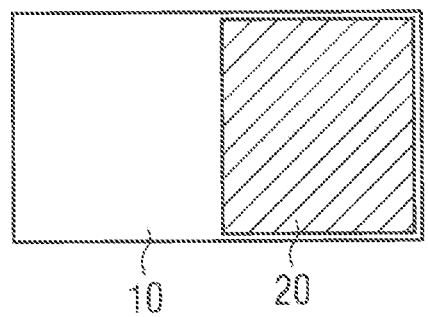
Figure 8B:
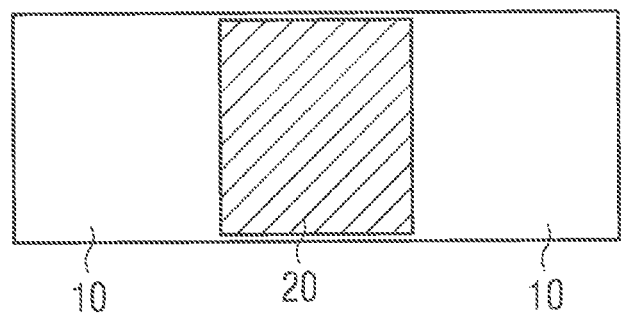

In the exemplary embodiment in FIG. 8B, exactly one detector 20 is arranged between exactly two optoelectronic components 10.

Figure 8C:
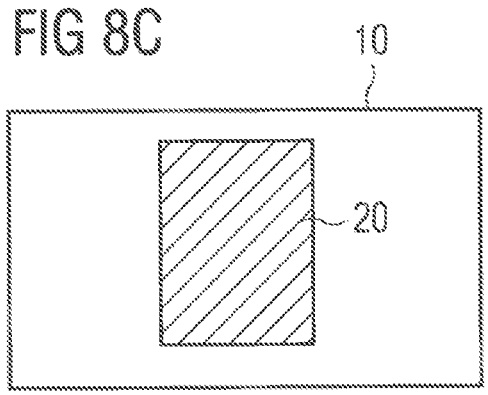

In the exemplary embodiment in FIG. 8C, the optical elements 4 of the two optoelectronic components 10 are connected to each other. This means that the optical elements can in this case be designed to be one piece and, for example, be manufactured with each other. This makes it particularly easy to manufacture the optoelectronic assembly. It is also easier to attach such a one-piece optical element to the housing 3.

Figure 8D:
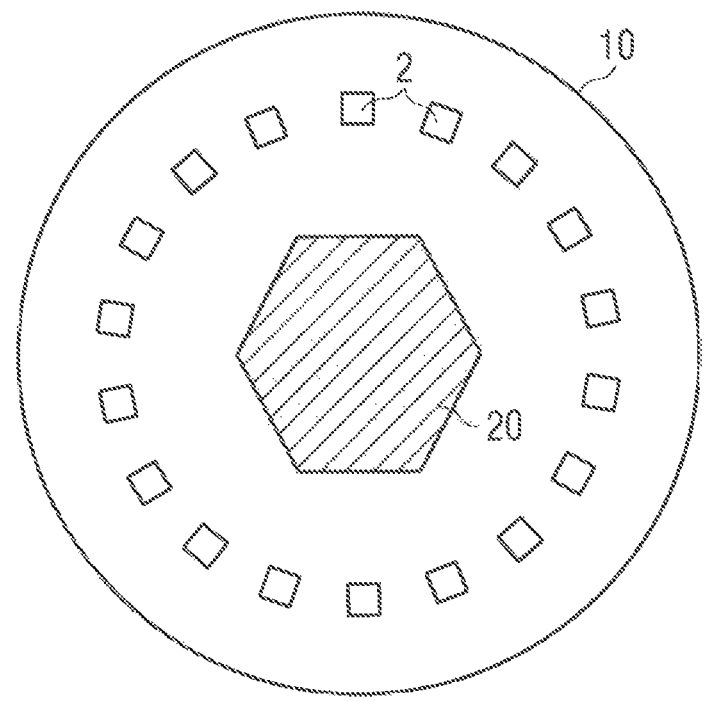

Lastly, FIG. 8D shows an exemplary embodiment in which a detector 20 is arranged centrally and is surrounded by a single optoelectronic component 10. The optoelectronic component 10 can in this case comprise a plurality of radiation-emitting optoelectronic semiconductor chips 2, which are arranged around the detector 20 along a circle with its center in the geometric center of the detector 20.

In the exemplary embodiments, optoelectronic semiconductor chips 2 are mostly described as radiation-emitting semiconductor chips. However, it is also possible that, in each exemplary embodiment, the radiation-emitting semiconductor chips 2 are radiation-receiving semiconductor chips. The detector chips 21 can then be radiation-emitting semiconductor chips or radiation-receiving semiconductor chips. In the event that the optoelectronic semiconductor chips 2 are radiation-emitting, the beam paths shown of the electromagnetic radiation 5 extend in the opposite direction.

The description based on the exemplary embodiments does not limit the invention to these exemplary embodiments. Rather, the invention includes any new characteristic and any combination of features, which in particular includes any combination of features in the claims, even if this feature or combination itself is not explicitly specified in the claims or exemplary embodiments.

The invention claimed is:

1. An optoelectronic component comprising:
    a carrier with a mounting surface on an upper side of the carrier;
    an optoelectronic semiconductor chip with a main surface facing away from the carrier;
    a housing impermeable to radiation; and
    an optical element with an outer surface and an inner surface that faces away from the outer surface,
    wherein the optoelectronic semiconductor chip is arranged on the mounting surface of the carrier so as to face the inner surface of the optical element,
    wherein the housing partially surrounds the optoelectronic semiconductor chip,
    wherein a first surface region of the inner surface is entirely flat and extends from the mounting surface towards the housing transversely to the main surface,
    wherein a second surface region of the inner surface extends towards the optoelectronic semiconductor chip, the second surface region directly adjoining the first surface region,
    wherein a third surface region of the inner surface extends from the second surface region towards the housing, and
    wherein the second surface region and the third surface region are TIR (Total Internal Reflection) reflectors.

2. The optoelectronic component according to claim 1, wherein the optical element in the first surface region is configured to direct electromagnetic radiation towards the second surface region.

3. The optoelectronic component according to claim 1, wherein the optical element in the second surface region is configured to direct electromagnetic radiation towards the third surface region.

4. The optoelectronic component according to claim 1, wherein the second surface region is arranged directly above the optoelectronic semiconductor chip.

5. The optoelectronic component according to claim 1, wherein the third surface region is arranged directly above the optoelectronic semiconductor chip.

6. The optoelectronic component according to claim 1, wherein the optical element adjoins the mounting surface in the first surface region.

7. The optoelectronic component according to claim 1, wherein no region of the housing is arranged on at least one side surface of the optoelectronic semiconductor chip.

8. The optoelectronic component according to claim 1, further comprising an additional optical element arranged between the third surface region and the housing.

9. The optoelectronic component according to claim 8, wherein the additional optical element is configured to change a direction of electromagnetic radiation.

10. The optoelectronic component according to claim 1, wherein the optoelectronic component is configured to detect electromagnetic radiation from a first half space and not to detect electromagnetic radiation from a second half-space.

11. The optoelectronic component according to claim 1, wherein the optoelectronic component is configured to emit electromagnetic radiation into a first half-space and not to emit electromagnetic radiation into a second half-space.

12. An optoelectronic assembly comprising:
the optoelectronic component according to claim 1; and
a detector comprising a detector chip,
wherein the optoelectronic component is configured to emit electromagnetic radiation into a first half-space and not to emit electromagnetic radiation into a second half-space,
wherein the detector chip is configured to detect electromagnetic radiation, and
wherein the optoelectronic semiconductor chip and the detector chip are separated from each other by a part of the housing.

13. The optoelectronic assembly according to claim 12, wherein the optoelectronic component comprises two or more optoelectronic components.

14. The optoelectronic assembly according to claim 13, wherein the detector is arranged between two of the optoelectronic components.

15. An optoelectronic component comprising:
a carrier with a mounting surface on an upper side of the carrier;
an optoelectronic semiconductor chip with a main surface facing away from the carrier;
a housing impermeable to radiation; and
an optical element with an outer surface and an inner surface that faces away from the outer surface,
wherein the optoelectronic semiconductor chip is arranged on the mounting surface of the carrier so as to face the inner surface of the optical element,
wherein the housing partially surrounds the optoelectronic semiconductor chip,
wherein a first surface region of the inner surface is entirely flat and extends from the mounting surface towards the housing transversely to the main surface,
wherein a second surface region of the inner surface extends towards the optoelectronic semiconductor chip, the second surface region directly adjoining the first surface region,
wherein a third surface region of the inner surface extends from the second surface region towards the housing,
wherein the optical element is a radiation-directing optical element, and
wherein the second surface region and the third surface region are TIR (Total Internal Reflection) reflectors.

16. The optoelectronic component according to claim 15, wherein the optical element in the first surface region is configured to direct electromagnetic radiation towards the second surface region, and wherein the optical element in the second surface region is configured to direct electromagnetic radiation towards the third surface region.

17. The optoelectronic component according to claim 15, wherein the second surface region is arranged directly above the optoelectronic semiconductor chip.

18. The optoelectronic component according to claim 15, wherein the third surface region is arranged directly above the optoelectronic semiconductor chip.

19. The optoelectronic component according to claim 15, wherein the optical element adjoins the mounting surface in the first surface region.

* * * * *